(12) United States Patent
Ottens et al.

(10) Patent No.: US 7,564,536 B2
(45) Date of Patent: Jul. 21, 2009

(54) LITHOGRAPHIC APPARATUS AND DEVICE MANUFACTURING METHOD

(75) Inventors: Joost Jeroen Ottens, Veldhoven (NL); Marcus Emile Joannes Boonman, Waalre (NL); Thomas Josephus Maria Castenmiller, Eindhoven (NL); Andre Bernardus Jeunink, Bergeyk (NL)

(73) Assignee: ASML Netherlands B.V., Veldhoven (NL)

( * ) Notice: Subject to any disclaimer, the term of this patent is extended or adjusted under 35 U.S.C. 154(b) by 563 days.

(21) Appl. No.: 11/268,777

(22) Filed: Nov. 8, 2005

(65) Prior Publication Data

US 2007/0103666 A1    May 10, 2007

(51) Int. Cl.
*G03B 27/58* (2006.01)
*G03B 27/42* (2006.01)
*G03B 27/62* (2006.01)
*B23Q 1/00* (2006.01)
*B23Q 3/00* (2006.01)

(52) U.S. Cl. .............................. 355/72; 355/53; 355/75; 269/53; 269/289 R; 269/903

(58) Field of Classification Search .................... 355/53, 355/72, 75, 77; 396/611; 269/53, 289 R, 269/903, 21; 248/560, 562; 250/492.1
See application file for complete search history.

(56) References Cited

U.S. PATENT DOCUMENTS

| 5,094,536 | A | 3/1992 | MacDonald et al. | ......... 356/358 |
| 5,923,408 | A | 7/1999 | Takabayashi | ................. 355/53 |

(Continued)

FOREIGN PATENT DOCUMENTS

EP    1 486 828 A2    12/2004

(Continued)

OTHER PUBLICATIONS

European Search Report issued for European Patent Application No. 06076991.6-1226, dated May 3, 2007.

*Primary Examiner*—Alan A Mathews
(74) *Attorney, Agent, or Firm*—Pillsbury Winthrop Shaw Pittman LLP

(57) ABSTRACT

A lithographic apparatus is disclosed that includes an article support constructed to support a first article, capable of imparting a radiation beam with a pattern in its cross-section to form a patterned radiation beam, in a beam path of the radiation beam or a second article to be placed in a beam path of the patterned radiation beam, the article support having a plurality of supporting protrusions on which the first article or the second article is disposed in use, wherein the plurality of supporting protrusions are constructed to define a support zone to provide a plane of support for the first article or the second article, so that when the first article or the second article is subjected to a thermal load the support zone allows at least a portion of the first article or the second article to expand or contract to reduce the build up of a mechanical stress in the first article or second article, respectively, while maintaining the first article or second article substantially fixed to the article support, and a position sensor configured to determine a position offset, in a direction lying in the plane of the support zone, of the first article or the second article over a period of time, and a projection system configured to project a patterned radiation beam onto a target portion of a second article.

47 Claims, 9 Drawing Sheets

U.S. PATENT DOCUMENTS

| | | | |
|---|---|---|---|
| 6,325,351 B1 * | 12/2001 | Hale et al. | 248/562 |
| 6,741,447 B2 | 5/2004 | Lee | |
| 7,213,963 B2 * | 5/2007 | Lof et al. | 366/53 |
| 7,355,126 B2 * | 4/2008 | Nishikawa et al. | 174/260 |
| 7,393,207 B2 * | 7/2008 | Imai | 432/259 |
| 2002/0043163 A1 | 4/2002 | Novak | 101/131 |
| 2004/0029065 A1 | 2/2004 | Kreiser et al. | |
| 2004/0178362 A1 | 9/2004 | Gilissen et al. | 250/492.1 |
| 2005/0140962 A1 | 6/2005 | Ottens et al. | 355/75 |
| 2005/0248746 A1 | 11/2005 | Zaal et al. | 355/75 |

FOREIGN PATENT DOCUMENTS

| | | |
|---|---|---|
| JP | 2002-134559 A | 5/2002 |
| WO | WO 2004/086496 A1 | 10/2004 |

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In conventional lithographic apparatuses, an article, such as a substrate or a reticle, is clamped on an article support by a clamping force. The article support may comprise a plurality of supporting protrusions which define a support zone for the article. The support zone is typically planar, for example, the X-Y plane. Such supporting protrusions may be referred to in the art as "burls". Conventional supporting protrusions are designed so that they reduce or prevent distortion of the article in the supporting plane. Conventionally, this is achieved by making the supporting protrusions as stiff as possible against (XY) movements in the plane of the support zone at the top of the protrusions. Conventional supporting protrusions are further designed in order to reduce or prevent distortions of the article out of the (XY) support plane, that is in the Z direction. Conventionally, this is achieved by making the supporting protrusions as stiff as possible against forces downwards along the Z-axis. In order to clamp the article to the article support, a vacuum may be applied to keep the article fixed on top of the supporting protrusions. In case of thermal load, the stiffness of the supporting protrusions, in particular in the (XY) direction defining the plane of the support zone, may not be not enough. As a result significant (XY) distortions of the article may arise in the plane of the support zone. In the case of the article being a substrate this may lead to overlay problems, and as a side effect also distortions out of the (XY) support plane may arise, which in the case of a substrate may lead to focusing problems. In particular, in the case where the article is a substrate, illumination induced substrate heating may result in the one or more of the problems outlined above. In particular, in high dose lithographic apparatuses, a substrate may absorb a lot of energy as a result of the exposure process. Unfortunately, the heat resistance of the supporting protrusions is typically so large that the heat absorbed by the substrate does not flow to the underlying substrate table (article support) fast enough. As a result, the substrate may still heat up locally, and therefore expand with respect to the substrate table. Conventional supporting protrusions of the substrate table try to reduce or prevent any distortions of the substrate in the (XY) support plane, but because the supporting protrusions (and the substrate table itself) have only a limited stiffness, the substrate may nevertheless distort significantly. For example, overlay effects of about 150 nanometers may occur. A side effect of the substrate table trying to, but not succeeding in, reducing or preventing distortions in the (XY) support plane is that the substrate may also be distorted out of the (XY) support plane, i.e. in the Z-direction, so that focus problems may result as well. Similar problems may occur in immersion lithography as well, as a result of contraction of substrates caused by cooling.

SUMMARY

It would be advantageous, for example, to provide an article support which allows any distortion suffered by an article supported by the article support during the lithographic process to be compensated for, in particular during those parts of the lithographic process when the article is subject to a thermal load.

According to an aspect of the invention, there is provided a lithographic apparatus, comprising:

an article support constructed to support a first article, capable of imparting a radiation beam with a pattern in its cross-section to form a patterned radiation beam, in a beam path of the radiation beam or a second article to be placed in a beam path of the patterned radiation beam, the article support comprising:

a plurality of supporting protrusions on which the first article or the second article is disposed in use, wherein the plurality of supporting protrusions are constructed to define a support zone to provide a plane of support for the first article or the second article, so that when the first article or the second article is subjected to a thermal load the support zone allows at least a portion of the first article or the second article to expand or contract to reduce the build up of a mechanical stress in the first article or second article, respectively, while maintaining the first article or second article substantially fixed to the article support, and a position sensor configured to determine a position offset, in a direction lying in the plane of the support zone, of the first article or the second article over a period of time; and a projection system configured to project a patterned radiation beam onto a target portion of a second article.

According to an aspect of the invention, there is provided a lithographic projection apparatus arranged to transfer a pattern from a patterning device onto a substrate, the lithographic projection apparatus comprising an article support constructed to support the substrate, the article support comprising a plurality of supporting protrusions on which the substrate is disposed in use, the plurality of supporting protrusions constructed to define a support zone to provide a plane of support for the substrate, so that when the substrate is subjected to a thermal load the support zone allows at least a portion of the substrate to expand or contract to reduce the build up of a mechanical stress, while maintaining the substrate substantially fixed to the article support, the article support further comprising a position sensor configured to determine a position offset, in a direction lying in the support zone, of the substrate over a period of time.

According to an aspect of the invention, there is provided an apparatus comprising an article support constructed to support an article, the article support comprising a plurality of supporting protrusions on which the article is disposed in use, wherein the plurality of supporting protrusions are constructed to define a support zone to provide a plane of support for the article, so that when the article is subjected to a thermal load the support zone allows at least a portion of the article to expand or contract to reduce the build up of a mechanical stress, while maintaining the article substantially fixed to the article support, the article support further comprising a position sensor configured to determine a position offset of the article over a period of time.

According to an aspect of the invention, there is provided a device manufacturing method, comprising projecting a patterned beam of radiation onto a substrate, flexibly supporting the substrate on an article support constructed to support the substrate to be placed in a beam path of the patterned beam, the article support comprising a plurality of flexible supporting protrusions on which the substrate is disposed in use, so that when the substrate is subjected to a thermal load, the plurality of flexible supporting protrusions allow at least a portion of the substrate to expand or contract to reduce the build up of a mechanical stress in the substrate, and determining a position offset of the substrate resulting from the expansion, contraction, drift, or any combination thereof, of the substrate over a period of time using a position sensor.

According to an aspect of the invention, there is provided a method comprising flexibly supporting an article on an article support, the article support comprising a plurality of supporting protrusions on which the article is disposed in use wherein the plurality of supporting protrusions are constructed to define a support zone to provide a plane of support for the article, so that when the article is subjected to a thermal load, the support zone allows at least a portion of the article to expand or contract to reduce the build up of a mechanical stress in the article, and further comprising determining a position offset of a point on the article resulting from expansion, contraction, drift, or any combination thereof, of the article over a period of time.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
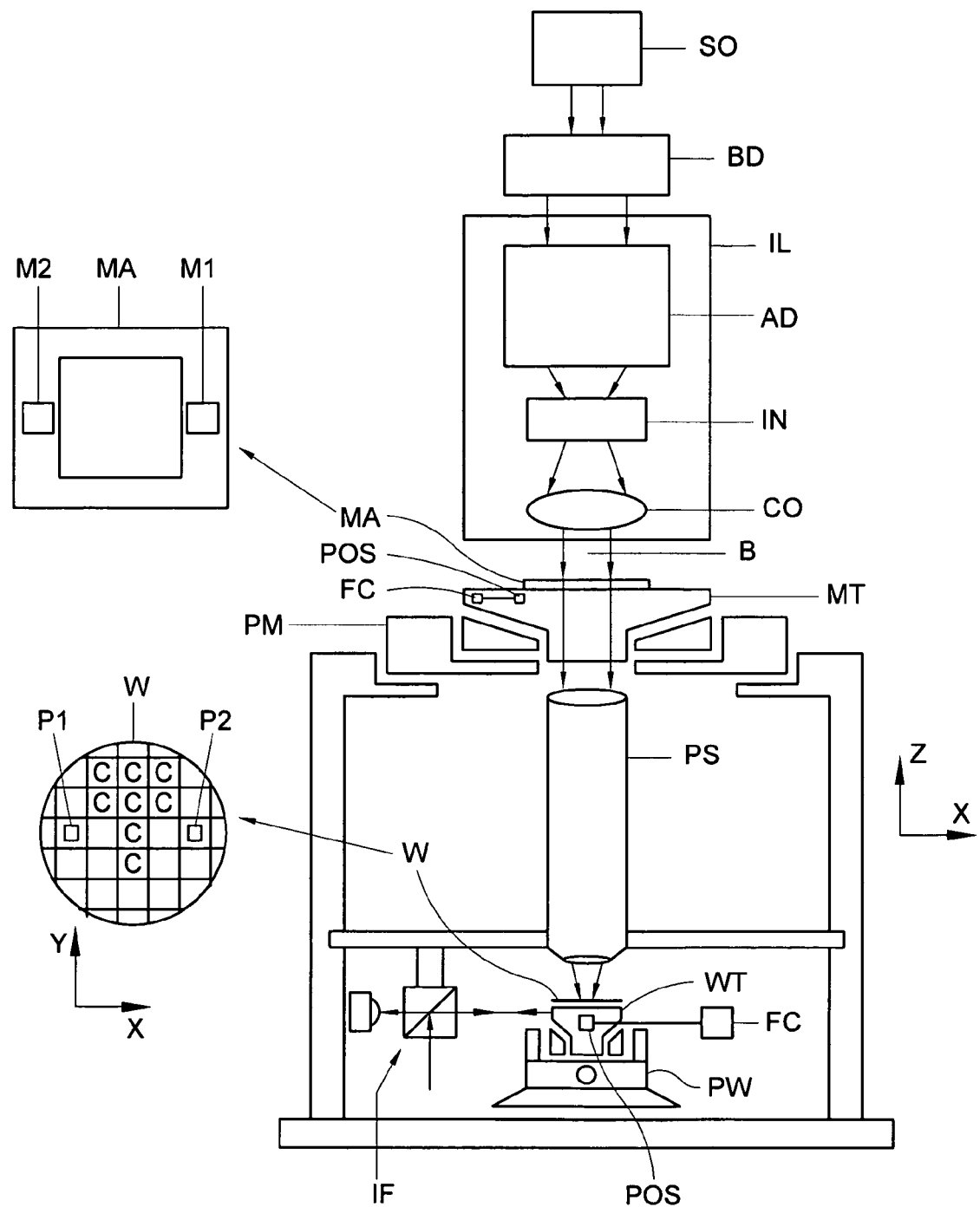
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The support structure and the substrate table may also be hereinafter referred to as an article support. An article includes but is not limited to: a patterning device, such as a reticle and a substrate, such as a wafer.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an embodiment of the invention, there is provided a lithographic apparatus comprising an illumination system IL configured to condition a radiation beam; an article support MT, WT respectively constructed to support a first article MA, capable of imparting the radiation beam with a pattern in its cross-section to form a patterned radiation beam B, in a beam path of the radiation beam or a second article W in a beam path of the patterned radiation beam; and a projection system PS configured to project a patterned radiation beam onto a target portion of the second article W.

In an embodiment, the article support MT, WT comprises a plurality of supporting protrusions which are constructed to define a support zone SZ to provide a plane of support for the first or second article MA, W, so that when the first or second article MA, W is subjected to a thermal load, the support zone SZ allows at least a portion of the first or second article MA, W to expand or contract to reduce or prevent the build up of a mechanical stress in the first or second article MA, W, respectively. The expression thermal load includes the effect of at least one of heating or cooling. The article support WT, MT further comprises one or more position sensor POS configured to determine one or more position offsets, respectively, of the first or second article MA, W resulting from the expansion or contraction of the first or second article, respectively, over a period of time. In one embodiment of the invention, the one or more position sensors POS are configured to determine the position offset(s) by determining a displacement of one or more of the supporting protrusions, described in more detail herein below. In an embodiment, the one or more position sensors POS are configured to determine the position offset (s) by determining a displacement of a respective point on the first or second article MA, W. In one embodiment, wherein the second article is a substrate W, the one or more position sensors POS comprises an optical sensor which is directed towards a backside of the substrate W to determine the position of the substrate directly. Further, the substrate may be provided with one or more reference marks whose position offset is determined by the optical sensor. FIG. 1 further depicts a feedback circuit FC configured to provide a signal to the illumination system IL, the projection system PS, the article support MT, WT, or any combination thereof, wherein the signal causes the illumination system IL, the projection system PS, or both, to configure a radiation beam and/or a patterned radiation beam, respectively, which takes into account the position offset and/or causes the article support to correct for the position offset.

Figure 2:
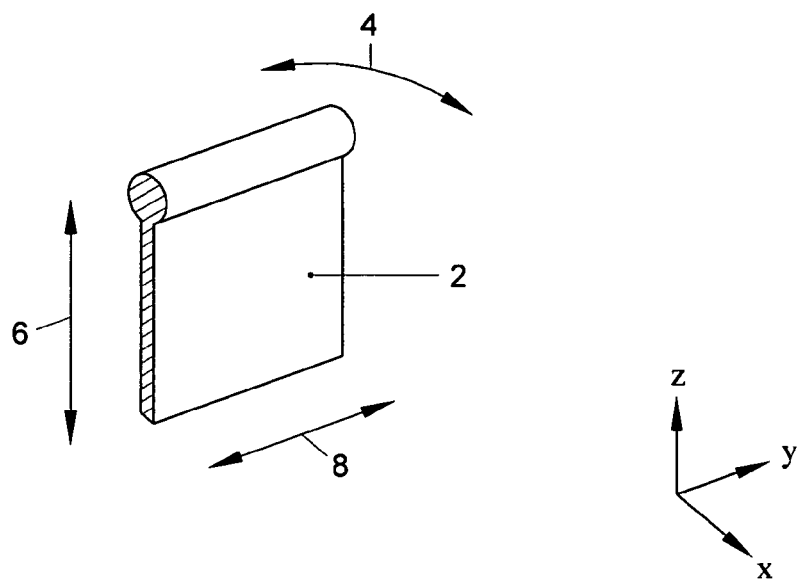
FIG. 2 depicts a supporting protrusion according to an embodiment of the invention.
Figure 4:
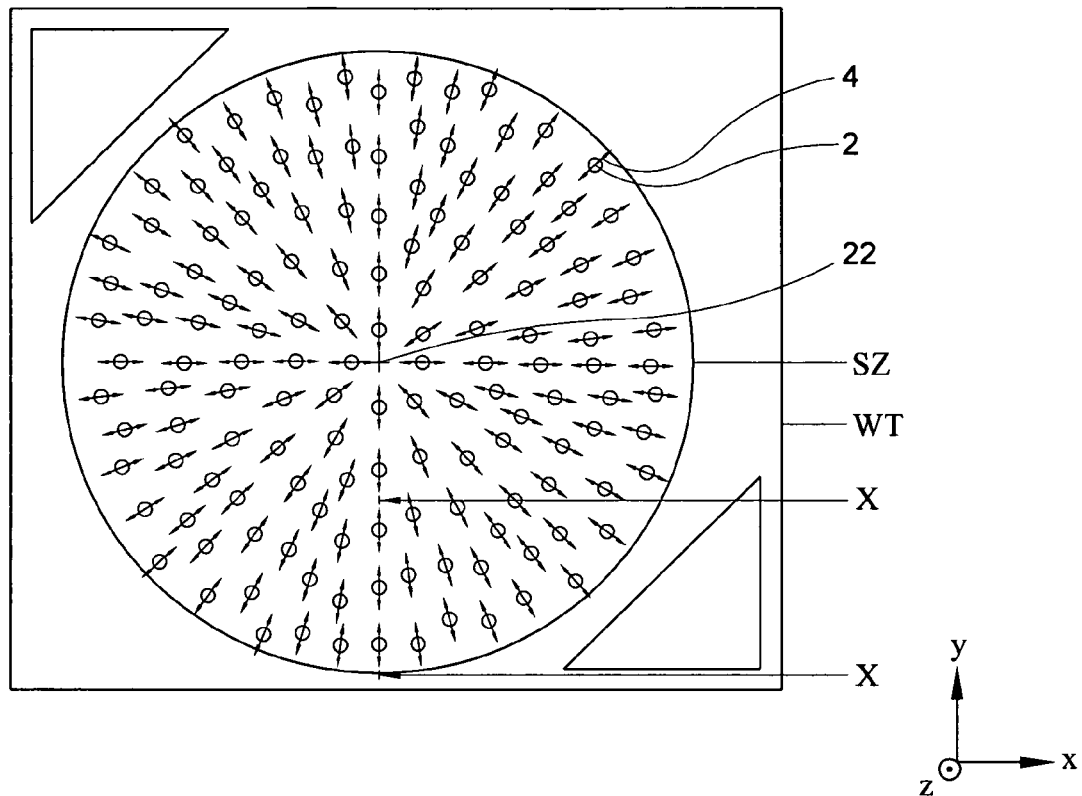
FIG. 4 depicts an article support comprising a plurality of supporting protrusions according to an embodiment of the invention.
Figure 6:
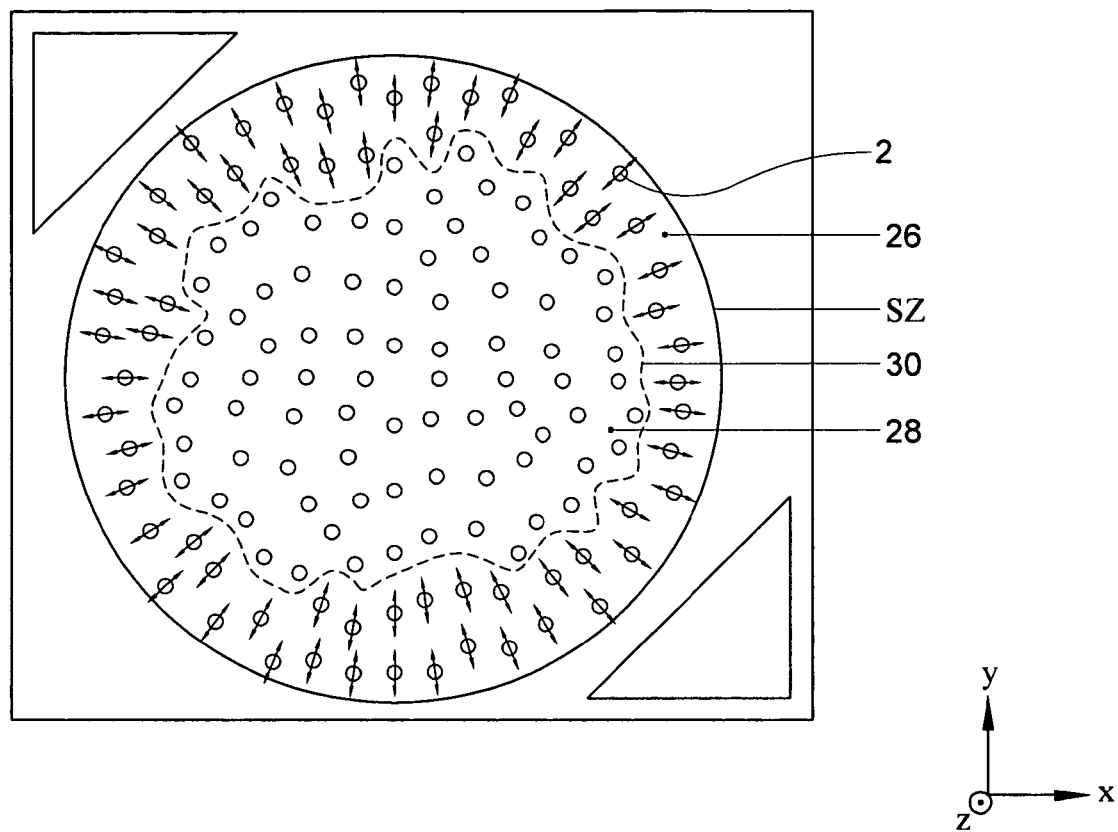
FIG. 6 depicts an article support comprising a plurality of supporting protrusions according to a further embodiment of the invention.
Figure 7:
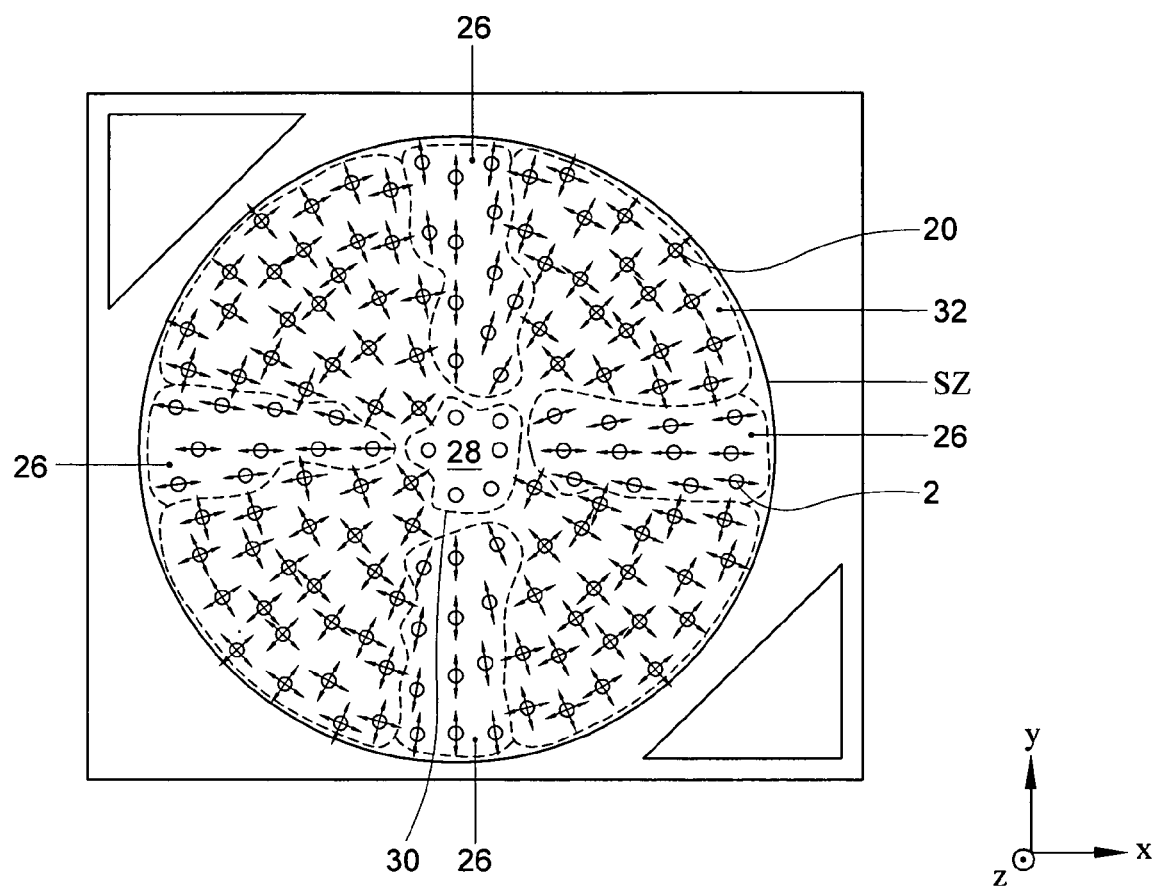
FIG. 7 depicts an article support comprising a plurality of supporting protrusions according to a yet further embodiment of the invention.

FIG. 2 depicts a supporting protrusion 2 according to an embodiment of the invention. The article support MT, WT comprises a plurality of supporting protrusions 2 that are dimensioned to be flexible and provide a support zone SZ for the article. According to an embodiment, at least some of the conventional stiff supporting protrusions on the article support MT, WT are replaced with supporting protrusions 2 which have at least one degree of freedom. The supporting protrusions 2 having at least one degree of freedom form a support zone SZ, as shown in FIGS. 4, 6 and 7. In particular, the support zone SZ comprises one or more of the supporting protrusions 2 constructed to have a first degree of freedom 4 in a plane XY (see, e.g., FIG. 5) in which the first or second article MA, W is disposed in use. In particular, the one or more supporting protrusions 2 are oriented so that the first degree of freedom extends in a direction 4 corresponding to a first direction in which the position offset extends to allow the first or second article to expand or contract in the first direction. In this way, when the article MA, W is subject to a thermal load, for example, when substrate heating and cooling occurs, any global expansion of the substrate will not be restricted any more by the supporting protrusions on the substrate table. In particular, deviations of the article in a direction out of the support zone SZ are suppressed, while maintaining the article fixed to the article support. That is, in this way, the substrate is allowed to expand and contract globally. Because the latter global expansion/contraction is a major effect of cooling/heating of a substrate, the amount of stress being built up between the substrate and the substrate table is reduced with respect to conventional substrates and substrate tables. In this way, focus errors due to this kind of stress build up may be reduced or prevented. It is noted that the substrate W remains fixed on the substrate table in the XY plane due to the stiffness of the substrate in combination with a certain amount of stiffness which the supporting protrusions 2 retain in directions other than their direction of freedom. A certain degree of stiffness is desired during measuring and exposing of the substrate.

Since the substrate is allowed to expand and/or contract as a result of a heating and/or cooling, the position offset will be larger than is experienced in conventional situations. To compensate for the position offset, one or more position sensors POS are integrated into one or more of the supporting protrusions 2. In this way, the induced position offset can be measured. A first step comprises reading one or more position sensors during a process in which the substrate is measured. A further step includes reading one or more position sensors just before the patterned beam of radiation is projected onto the substrate. The difference between the readings obtained during the process in which the substrate is measured and just before the patterned beam of radiation is projected onto the substrate is determined and the difference is used to calculate an optimal intrafield parameter offset. The optimal intrafield parameter offset may be applied during the projection of the patterned beam onto the substrate. The step of reading the one or more position sensors just before exposure can be repeated for every die. The step of reading can be done per exposure. Also, it can be done once before the exposure as a whole. In this way, the global expansion/contraction may not deteriorate the overlay. As described with reference to FIGS. 8-10, one or more strain gauges and/or one or more capacitive sensors may be used to measure the position offset of the supporting protrusions.

In the embodiment shown in FIG. 2, the supporting protrusion 2 is constructed as a leaf spring. In this way, a degree of freedom in a first direction 4 is provided while providing adequate stiffness in other directions. The dimensions of the supporting protrusions 2 may be of the order of 100 micrometers in the Z direction 6 and of the order of 50 micrometers in the Y direction 8. The supporting protrusions 2 may be made out of materials including, but not limited to Zerodur, Corderite and SiSiC.

In an embodiment, when a large radiation dose is used during the exposure process, the substrate may not able to dissipate the excess heat sufficiently quickly, so the substrate will try to expand. According to an embodiment, it is allowed to expand, that is a plurality of the supporting protrusions 2 will not try to prevent distortion in the XY plane anymore. Also, the expansion may occur predominantly in a radial direction, that is in a direction extending from the substrate origin outwards. Thus, in an embodiment, the plurality of supporting protrusions are oriented so that the first degree of freedom is aligned with a dominant direction of expansion/contraction, for example, radially. In this way, the supporting protrusions do not try to prevent radial distortion in the XY plane. Because of this, deviations out of the XY plane are reduced, that is focus errors are reduced by substrate heating/cooling, and for the same reason, the chance of slip is reduced.

It is noted that with conventional stiff supporting protrusions 2, when slip occurs, it may lead to major overlay errors because the substrate is not kept at the same location with respect to the substrate stage. In contrast, according to an embodiment, where the support zone allows an expansion or contraction of the article, if slip occurs, overlay errors may arise because the one or more position sensors may not sense the actual position of the point of the article of concern anymore. Advantageously, however, the chance of slip occurring is much reduced in one or more embodiments of the invention. This is because the protrusions have been given a degree of freedom in a significant direction and the friction force between the article and the protrusion will hardly ever be overcome, so that the chance of slip is reduced significantly. The resulting radial (X,Y) position offset of the plurality of supporting protrusions 2 with respect to its position during the process in which the substrate is measured, is determined, and from the radial (X,Y) position offsets of neighboring supporting protrusions, for a certain die, optimal parameter offsets are calculated and are applied to obtain an optimal overlay. In an embodiment, these optimal parameter offsets are applied by providing feedback to the illumination system in the case of the article being a reticle, and to the projection system in the case of the article being a substrate. In a further embodiment, these optimal parameter offsets are, additionally or alternatively, applied by providing feedback to the article support. In this way, the radial XY effects of illumination induced substrate heating are measured and compensated for without, for example, using send ahead substrates or having to rely on a feed forward model.

Figure 3:
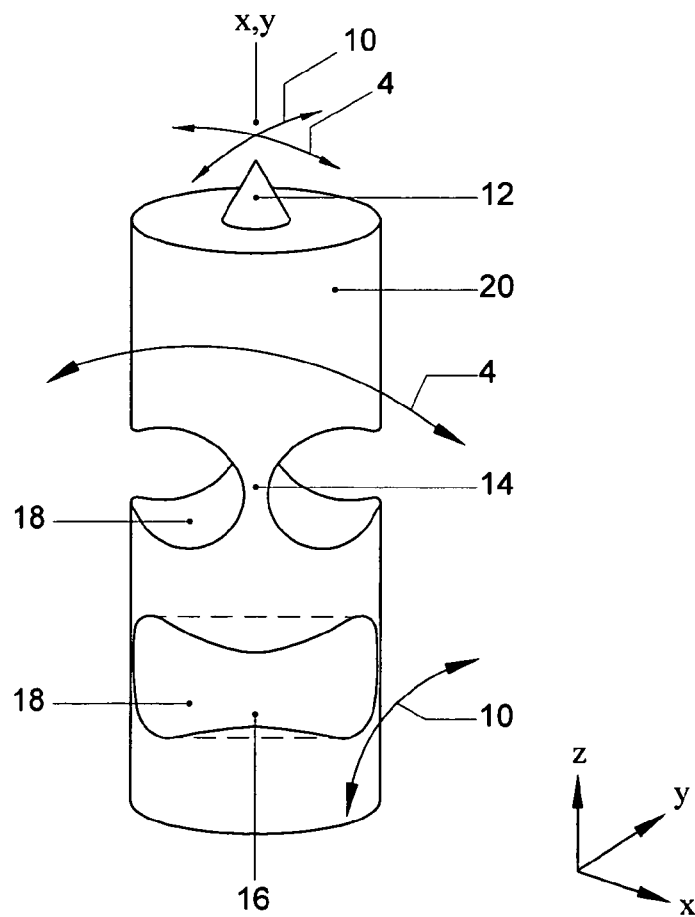
FIG. 3 depicts a supporting protrusion according to a further embodiment of the invention.

FIG. 3 depicts a supporting protrusion according to a further embodiment of the invention. FIG. 3 depicts a supporting protrusion 20 having a second degree of freedom 10. In this way, the substrate is not kept fixed in any direction in the XY plane, i.e. the plane of support by the plurality of supporting protrusions 2. Instead, the supporting protrusions are constructed so that they do not restrict radial XY movements of the top 12 of the supporting protrusion 20. The supporting protrusion 20 provides stiffness in the downward (Z) direction only and is free in both the X and Y directions, as indicated by arrows indicating directions 4, 10, respectively, where direction 4 corresponds to free rotation around the Y-axis and direction 10 corresponds to free rotation around the X-axis. In particular, the second degree of freedom 10 extends in a direction substantially orthogonal to the direction 4 in which the first degree of freedom extends in the plane (XY) in which the first or second article MA, W is disposed in use on the plurality of supporting protrusions 2, 20. In particular, the second degree of freedom extends in a second direction 10 in which the position offset extends to allow the first or second article MA, W to expand or contract in the second direction. The supporting protrusion 20 comprises a first fulcrum 14 to allow the supporting protrusion 20 to pivot around in the first direction 4 and a second fulcrum 16 to allow the supporting protrusion 20 to pivot around in the second direction 10. The first and second fulcra 14, 16 may be formed by recesses disposed on opposing sides of the supporting protrusion in the first and second directions in order to provide the first and second degrees of freedom 4, 10, respectively.

FIG. 4 depicts an article support comprising a plurality of supporting protrusions according to an embodiment of the invention. As mentioned the article support comprises a plurality of supporting protrusions dimensioned to provide a support zone SZ. In FIG. 4, for the sake of clarity only relatively few supporting protrusions are shown as black dots. The degrees of freedom of each supporting protrusion are indicated by the arrows extending through the black dots. In an embodiment, the distribution density of supporting protrusions is typically of the order of around 150,000 protrusions/m$^2$, e.g., 12000 protrusions underneath a wafer having diameter of 300 mm, i.e. covering an area of $pi*r^2=pi*(0.3/2)^2=0.07065$ m$^2$, then a density $=12000/0.07065$ [m$^2$]$\sim$150,000 m$^{-2}$. It will be understood that the distribution and density of the supporting protrusions will depend on factors including the article to be supported and the construction and materials of the supporting protrusions. The support zone SZ shown in FIG. 4 is constructed of a plurality of supporting protrusions 2 having one degree of freedom. In the embodiment shown, the supporting protrusions 2 have the construction illustrated and described with respect to one or more of FIG. 2, FIG. 8, FIG. 10, or FIG. 11. As mentioned, an article subject to a thermal load expands/contracts predominantly in a radial direction with respect to the origin of the article. Thus, in order to allow expansion/contraction to occur predominantly in a radial direction extending from the origin of the article outwards, the supporting protrusions 2 are oriented so that the one degree of freedom 4 is aligned radially so that the article when disposed on the support zone SZ has its origin substantially aligned with an origin 22 of the support zone SZ. In other words, the direction 4 of the degree of freedom of the supporting protrusions 2 is radial with respect to a location 22 on the support zone SZ corresponding to a center of the first or second article MA, W, respectively, when the first or second article is disposed on the support zone SZ.

In particular, the radial direction extends from the location 22 in an outwardly direction in the plane (XY) in which the first or second article is disposed in use on the support zone. For example, by orienting the flexible supporting protrusions 2 in the radial direction with their single degree of freedom in combination with the stiffness of the substrate W, the substrate W is kept fixed on the substrate table WT during the measurement and exposure process. As mentioned above, because the movement of the supporting protrusions 2 are not restricted, the radial offsets may be larger than in conventional apparatuses. To compensate for the radial offsets, one or more position sensors are integrated into at least some of the supporting protrusions 2, as discussed in more detail with reference to FIGS. 8-10. In an embodiment, rather than integrating one or more position sensors into the supporting protrusions, the one or more position offsets can be determined, for example, by using a sensor that senses the backside of the article, in particular, a substrate.

Figure 5:
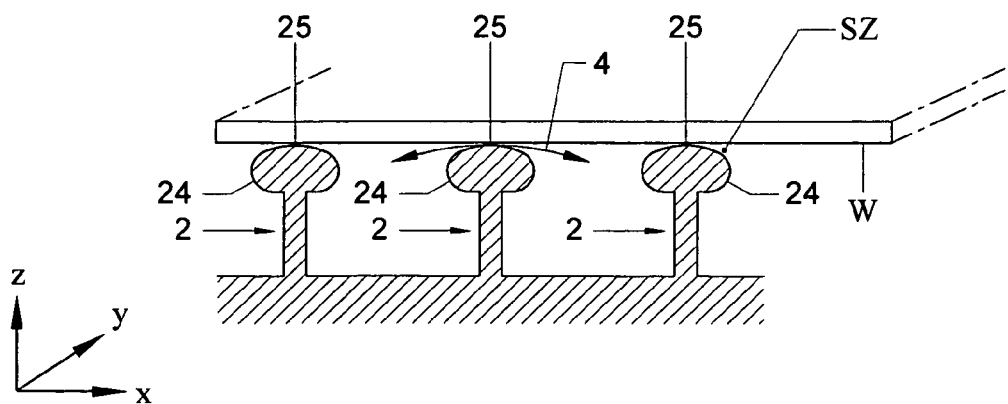
FIG. 5 depicts a cross-section through the line X-X shown in FIG. 4.

FIG. 5 depicts a cross section through the line X-X shown in FIG. 4. In particular, FIG. 5 shows the support zone SZ comprised of the plurality of supporting protrusions 2. The support zone SZ lies in the XY plane. In an embodiment, the support zone SZ is substantially flat. The substrate W is supported on the support zone SZ by the plurality of supporting protrusions 2. The supporting protrusions 2 have their degree of freedom 4 aligned radially and extending in the Y direction. The top 24 of each supporting protrusion 2 is rounded having a sphere or sphere like form. In this way, the article is free to move at the top surface 25 of the top 24 of the supporting protrusion 2.

FIG. 6 depicts an article support comprising a plurality of supporting protrusions according to a further embodiment of the invention. It may not be necessary to provide all supporting protrusions with a degree of freedom. Depending on the application, the distribution of supporting protrusions having zero, one or two degrees of freedom may be chosen accordingly. In the embodiment shown in FIG. 6, the article support comprises a support zone SZ in which the substrate W is supported in use, wherein the support zone SZ comprises a first region 26 comprising the one or more supporting protrusions 2 having the first degree of freedom, wherein the first region 26 supports an area of the substrate having a larger than average expected offset. For example, an outer edge of the substrate may experience a larger than average expansion/contraction. Thus, in an embodiment, the first region 26 supports an outer edge of the substrate. In this way, article support is adapted to allow expansion in the most desired region of the substrate. In the embodiment shown in FIG. 6, the support zone SZ comprises a second region 28 comprising a plurality of supporting protrusions 30 having zero degrees of freedom, respectively. In particular, the second region 28 supports an area of the substrate having a smaller than average expected offset. In this way, in regions where less expansion/contraction is expected, conventional supporting protrusions having a degree of stiffness can be provided. For example, a central region of the substrate may experience a smaller amount of expansion/contraction. Thus, in an embodiment, the second region 28 supports a central region of the first or second article. The second region 28 may be provided adjacent the first region 26.

FIG. 7 depicts an article support comprising a plurality of supporting protrusions according to a yet further embodiment of the invention. FIG. 7 shows yet another arrangement whereby the support zone SZ is comprised of a plurality of supporting protrusions 2 having one degree of freedom, a plurality of supporting protrusions 20 having two degrees of freedom and a plurality of supporting protrusions 30 having zero degrees of freedom. The support zone SZ comprises a plurality of first regions 26 comprising a plurality of supporting protrusions 2 having a first degree of freedom, a second region 28 comprising a plurality of supporting protrusions 30 having zero degrees of freedom and a third region 32 comprising a plurality of supporting protrusions 20 having a second degree of freedom. In this way, a balance between providing flexibility to allow the article to expand and contract is balanced with the desire to provide a support having some stiffness to keep the article coupled to the underlying substrate table.

Figure 8:
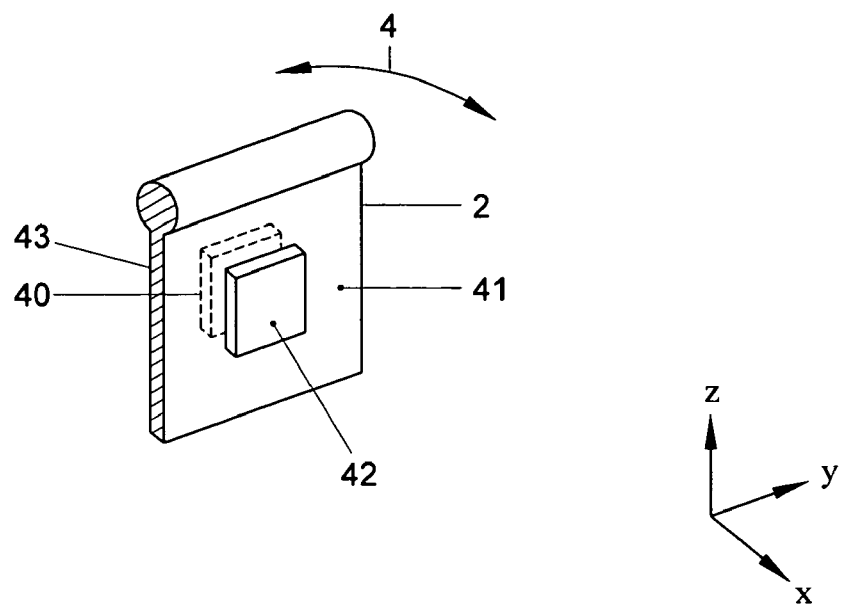
FIG. 8 depicts a supporting protrusion according to an embodiment of the invention.

FIG. 8 depicts a supporting protrusion according to an embodiment of the invention. Since the position offsets (e.g., the radial offsets) are generally larger than in a conventional apparatus due to the flexible supporting protrusions 2, 20, according to an embodiment of the invention, the position offsets are measured so that they can be corrected for during, for example, the exposure process. To achieve this one or more sensors 40, 42, are integrated into some of the supporting protrusions, typically a proportion of supporting protrusions, to measure the position offset in the XY plane that the supporting protrusion has experienced since the measurement of the substrate W process, so that during the exposure of a die, the position offsets of all the supporting protrusions around that die can be compensated for. In particular, the one or more position sensors determine the position offset of a certain point on the article by determining a displacement of one or more of the supporting protrusions. The position offsets measured for all the supporting protrusions can be used to determine the optimal intrafield parameter offsets for the next die, to be applied on top of the substrate grid as measured during the measurement of the substrate process. These parameters may include translation, rotation, magnification, asymmetrical rotation, and/or asymmetrical magnification. It is noted that the latter two parameters can be corrected for on scanner systems. These parameters can then be corrected for during the actual exposure of the concerned die so that the overlay of this die will not contain the position offsets which the substrate had around the particular die. To achieve this, sensors can be provided to measure per supporting protrusion the position offset. It is not necessary to measure all supporting protrusions. However, if there are, for example, 12000 supporting protrusions, sensors may be provided for 200 of these supporting protrusions. For an article (for example, a substrate) having a diameter of 300 millimeters, approximately 4000 to 30000 supporting protrusions may be provided. The ratio of protrusions provided with a position sensor may be from 1/20 to 1/100. Thus, the proportion is relatively small. The sensors determine the difference in position of the supporting protrusion just before an exposure takes place with respect to the position measured during the measurement of the substrate process, so the sensor only has to be stable during the measure/exposure of the substrate. In the embodiment shown in FIGS. 8, 10, 11 and 12, a sensor is integrated with the supporting protrusion 2. The accuracy of the sensor is of the sub-nanometer range, because the overlay of the lithography apparatus directly depends on the accuracy of the sensor. It is noted that during substrate measurement, the one or more position sensors are measured (i.e. 'zero'ed), so that their reference is the situation during article measurement. In FIG. 8, the supporting protrusion 2 is provided with one or more strain gauges to determine the displacement. The strain gauge may be manufactured using MEMS technology. For other types of position sensor, and for creating the supporting protrusions with the required degrees of freedom, MEMS-technology can be used as well. A resisting layer can be sputtered onto, for example, silicon. In an embodiment, the supporting protrusion comprises first and second faces 41, 43 extending in a plane orthogonal to the first direction 4, on which a first and second strain gauge 40, 42 are disposed, respectively, so that the displacement of the supporting protrusion 2 is determined by a compression and/or expansion of the first and/or second strain gauges 40, 42. When the supporting protrusion is moved in its free direction, then one strain gauge will be compressed and the other one will be extended, so the resistance change will be about equal, but have a different sign.

Figure 9:
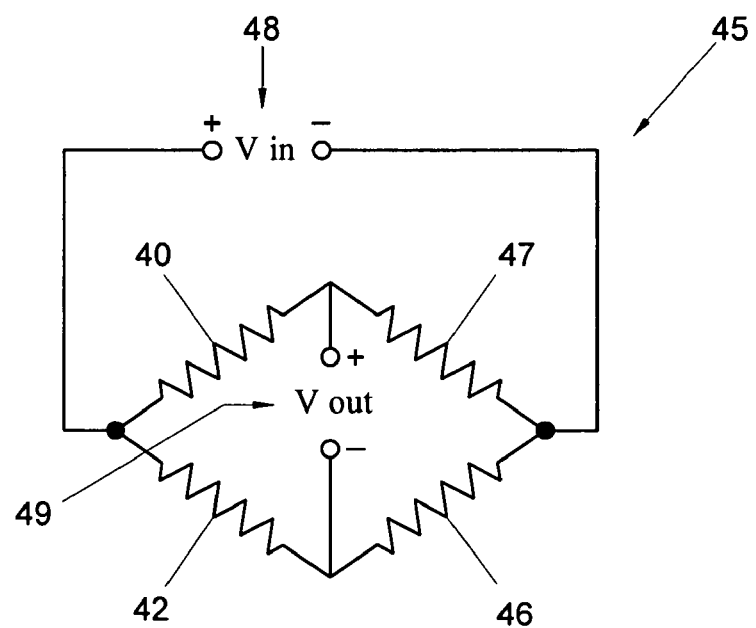
FIG. 9 depicts a circuit configured to accurately determine strain according to an embodiment of the invention.

FIG. 9 depicts a circuit to determine strain according to an embodiment of the invention. Since the resistance change will be about equal, but have a different sign, the two strain gauges of the supporting protrusion can be put together in a Wheatstone bridge configuration 45, as shown in FIG. 9. In this way, the accuracy can be increased, for example, the "common mode rejection" is possible, i.e. any common effect on both sensors, e.g. ambient temperature rise, will be cancelled out. The Wheatstone bridge 45 has a conventional configuration comprising the first strain gauge 40 and the second strain gauge 42 on the one side and two reference resistors 46, 47 on the opposite side of the Wheatstone bridge, a voltage input 48 and a voltage output 49.

Figure 10:
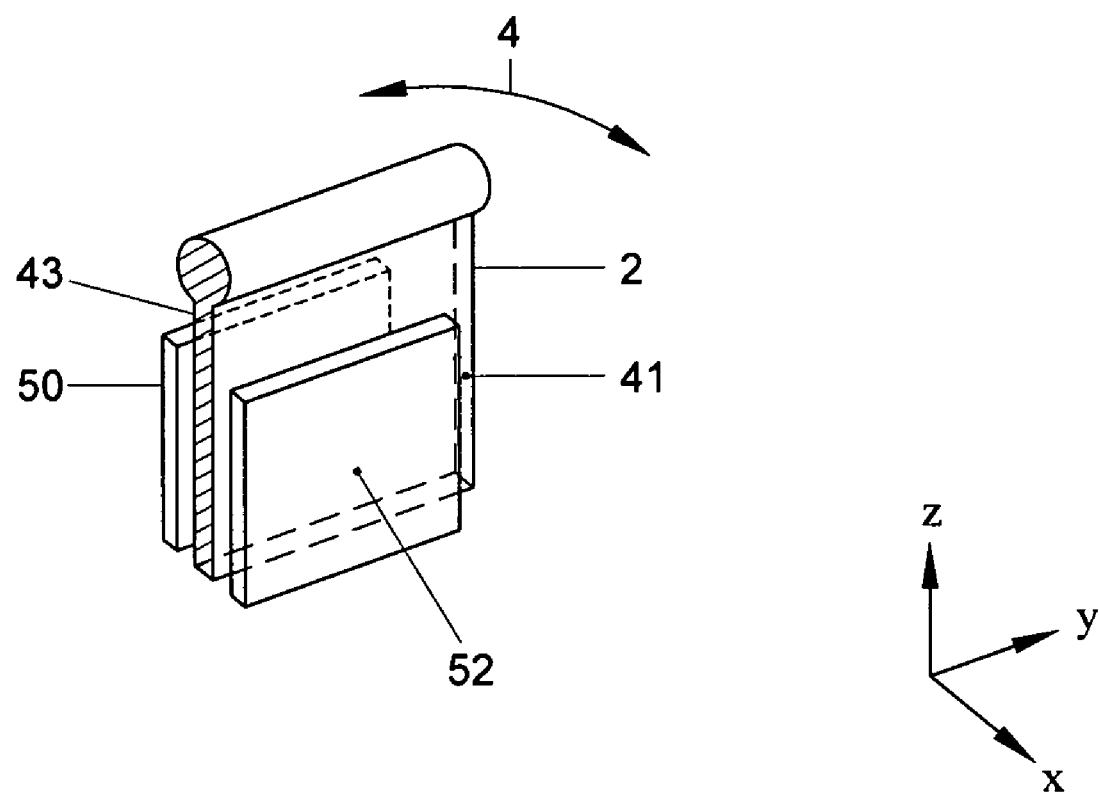
FIG. 10 depicts a supporting protrusion according to a further embodiment of the invention.

FIG. 10 depicts a supporting protrusion according to a further embodiment of the invention. In this embodiment, the supporting protrusion 2 is provided with one or more capacitive plates 50, 52 to determine the displacement of protrusion 2. The supporting protrusion 2 comprises first and second faces 41, 43 extending in a plane orthogonal to the first direction 4, on which a first and a second capacitive plate 50, 52 are disposed, respectively, so that the displacement of the supporting protrusion is determined by the capacitance measured across the first and second capacitive plates 50, 52. In this embodiment, the capacitive plates act as a capacitive sensor to determine the position offset of the supporting protrusion. In an embodiment, the capacitive sensor 50, 52 has a sub-nanometer resolution. In an embodiment, the first and second capacitive plates 50, 52 are arranged in a Wheatstone bridge configuration.

For the configuration of the supporting protrusions used in an immersion apparatus, the change in charge of a capacitor plate 50, 52 caused by 1 nanometer position change of the top of the supporting protrusion may be accurately measured in practice. The electrical signal of the first and second capacitive plates 50, 52 to determine the position offset of the supporting protrusion can also be combined in a Wheatstone bridge, similar to that shown in FIG. 9 for the strain gauges 40, 42, except that for the Wheatstone bridge for the first and second capacitive plates, the bridge may be excited in AC mode. It is noted that the substrate may act as a parasite capacitor. However, since only the difference in the position during the exposure with respect to that during the measurement of the substrate, is to be determined, the parasite capacitor effect should be cancelled out.

Figure 11:
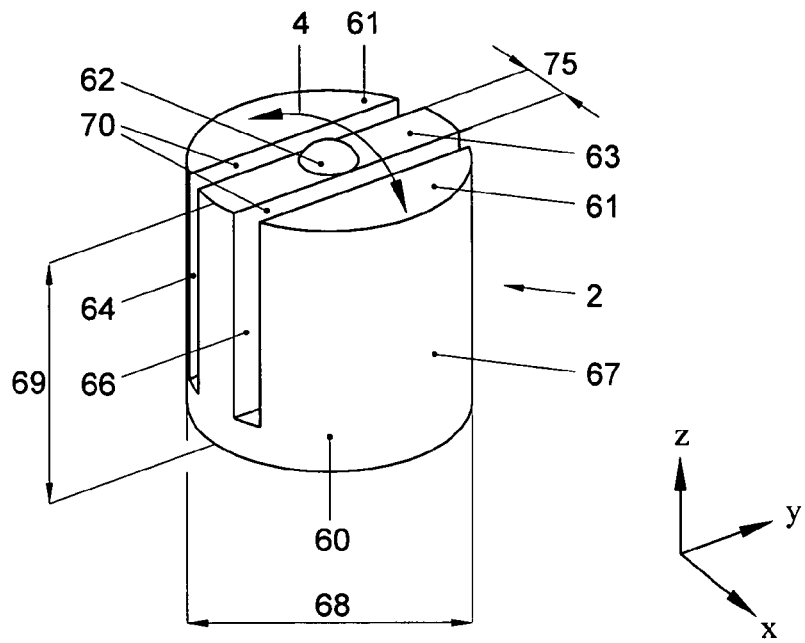
FIG. 11 depicts a supporting protrusion according to a further embodiment of the invention.

FIG. 11 depicts a supporting protrusion according to a further embodiment of the invention. One or more of the embodiments may have application in immersion lithography. In immersion lithography, once the substrate has passed by the immersion liquid confinement structure after an exposure, it may happen that a thin film of liquid (e.g., water) may remain. This liquid may then evaporate quickly and therefore, the substrate may quickly lose heat. In such a situation this heat loss may not be compensated for quickly enough by heat from the substrate table WT because the heat resistance of the supporting protrusions is considerable. As a result, the substrate may cool down locally, and therefore try to contract there. Because of the limited stiffness of conventional supporting protrusions and the substrate table itself, the substrate may distort in the XY plane. For the same reasons given above, distortions out of the XY plane may also arise, possibly leading to focus errors. FIG. 11 depicts a supporting protrusion 2 for use in immersion lithography having a first degree of freedom in a first direction 4. The supporting protrusion 2 comprises a body 60 and a top 62 on which the substrate is disposed. The body 60 is provided with a first and second groove 64, 66 which give the supporting protrusion 2 its degree of freedom in direction 4. The grooves 64, 66 are provided on opposite sides of the top 62. The body 60 including the surface area of the grooves may be provided with a conductive coating 67. In an embodiment, the body is cylindrical in form. The outer portions 61 of the body separated from a central portion 63 form capacitive plates 61, 63, which can be connected as described with reference to FIG. 10 in a Wheatstone bridge configuration to determine the position offset of the supporting protrusion 2 in the direction 4.

Typical dimensions for such a supporting protrusion 2 include: diameter 68 of the body is around 2 millimeters, the height 69 of the body is around 0.4 millimeters, the width of the grooves 64, 66 is typically around 15 micrometers, and the distance 75 between the grooves 64, 66 is around 150 micrometers. It will be understood that these dimensions will vary depending on the application. The pitch between supporting protrusions is in the order of 1-5 millimeters.

Figure 12:
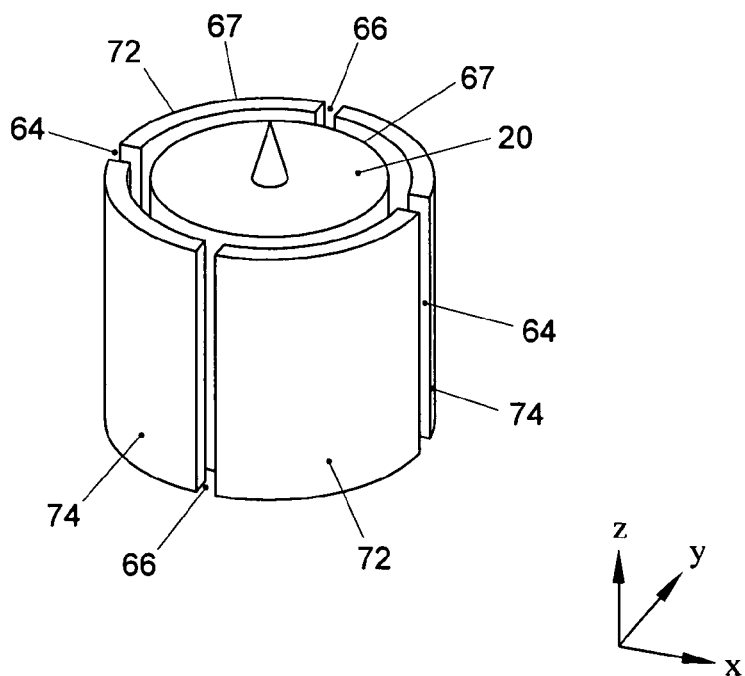
FIG. 12 depicts a supporting protrusion according to a yet further embodiment of the invention.

FIG. 12 depicts a supporting protrusion according to a yet further embodiment of the invention. In particular, FIG. 12 depicts a supporting protrusion 20 for use in immersion lithography having two degrees of freedom in first and second directions. The flexible supporting protrusion is provided with a conductive coating 67. Further provided are two position sensors to determine the position offset of the supporting protrusion 20. Each position sensor comprises a set of conducting plates 72, 74. The conducting plates are opposing. The first set of conducting plates 72 and the second set of conducting plates 74 function as two capacitors, as described with reference to FIG. 10. Further, the capacitors 72, 74 can both be provided in a Wheatstone bridge configuration. i.e. two Wheatstone bridges are provided, one Wheatstone bridge for each direction, to obtain an accurate first and second direction position offset of the flexible supporting protrusion 20. In particular, the first set of conducting plates 72 may sense the position offset in the X direction and the second set of conducting plates 74 may sense the position offset in the Y direction. The conducting plates 72, 74 are fixed. Further, they may be provided with a conductive coating 67. In this way, the supporting protrusion 20 with capacitive plates to determine the position offset, is integrated into the supporting protrusion for use in immersion lithography. This configuration can be achieved by appropriate grooves 64, 66, 76 in the supporting protrusion and a conductive coating 67.

For the embodiments shown in FIGS. 11 and 12, a groove width of 15 micrometers may be large enough to obtain a change in capacitance which is measurable in practice.

For example, taking the embodiment shown in FIG. 11, a capacitor plate may be 2 millimeters wide and 0.4 millimeters high. The distance 75 between the central portion 61 and the outer portions 63 may be 15 micrometers. When the top of the supporting protrusion 2 moves with a certain distance in its free direction, while the "foot" of the supporting protrusion remains fixed, it is assumed that the resulting capacitor change equals 0.3 times the capacitor change that would arise if the capacitor plate as a whole would have moved towards the supporting protrusion with that distance. Thus to take into account the flexing of the capacitor plate, a factor of 0.3 is assumed.

The capacitance of the capacitor in FIG. 11 or one of the two capacitors in FIG. 12 can be calculated as follows:

$$C = \frac{\varepsilon_0 \varepsilon_r A}{d}$$

To determine the capacitance change (or the change in charge $\Delta Q$, per applied voltage) that results in 1 nanometer position change of the top of the supporting protrusion:

$$\Delta C = -k \frac{\varepsilon_0 \varepsilon_r A}{d^2} \Delta d = \frac{\Delta Q}{appliedvoltage},$$

where k is the factor 0.3.

Thus, $$\frac{\Delta Q}{appliedvoltage} = (0.3) \frac{(8.9e-12)(1.0)((0.4e-3)(2e-3))}{(15e-6)^2}(1e-9)$$
$$= 9.5e-18 [C/appliedVolt]$$

1 electron has a charge of 1.6e-19 Coulomb, so for 1 nanometer deflection of top of the supporting protrusion, the following is obtained:

$$\frac{\Delta Q}{appliedvoltage} = \frac{9.5e-18}{1.6e-19} = 59 [electrons/appliedVolt]$$

This is larger than the 7 electron per applied Volt which is considered as a rough estimate of the minimum detectable charge per applied Volt in practice.

A further advantage of this design is its robustness. Further, the flexible portion of the supporting protrusion 20 is protected by the surrounding conductive plates 72, 74. For example, the flexible portion of the supporting protrusion should not deflect so much that it breaks. This an advantage, in particular, when cleaning the substrate table WT.

Figure 13:
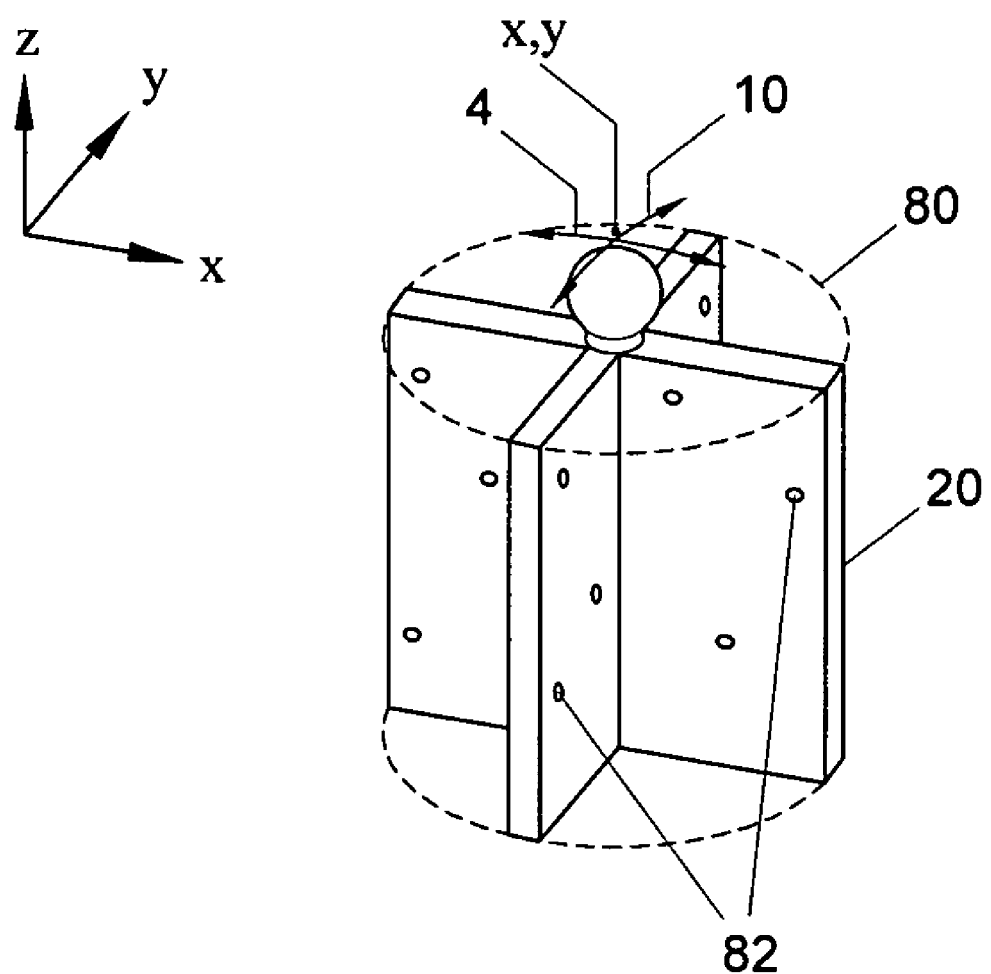
FIG. 13 depicts a supporting protrusion according to a yet further embodiment of the invention.

FIG. 13 depicts a supporting protrusion according to a yet further embodiment of the invention. In the embodiment, a supporting protrusion 20 is provided having two degrees of freedom 4, 10, as described with reference to FIG. 3. As with the embodiment shown in FIG. 3, the substrate is not kept fixed in the XY plane, i.e. the plane of support by the plurality of supporting protrusions 20. Instead, the supporting protrusions are constructed so that they do not restrict XY movements of the top 12 of the supporting protrusion 20. The supporting protrusion 20 provides stiffness in the downward (Z) direction only and are free in both the X and in the Y direction, as indicated by arrows indicating directions 4, 10, respectively, where direction 4 corresponds to free rotation around the Y-axis and direction 10 corresponds to free rotation around the X-axis. The supporting protrusion 20 shown in FIG. 13 is further provided with dampers 82 which ensure that the supporting protrusion 20 is stiff at high frequencies, for example, during scanning movements of the article support, such as the substrate table, but will be non-stiff, i.e., have a degree of flexibility, for low frequencies, for example, during the expansion of the article, such as a substrate. The dampers 82 may be based on a fluid such as air or a liquid. In the embodiment shown in FIG. 13, the dampers 82 comprise flexible walls provided with openings, in an embodiment relatively small openings. The flexible walls are provided within a fluid filled basin 80. In this way, a dampening effect on the supporting protrusion 20 is provided. With such a dampened supporting protrusion 20 having two degrees of freedom, it may not be necessary to provide additional supporting protrusions to keep the article on the article support because the friction forces keep the article fixed to the article support, assuming that the number of scanning movements in one direction will cancel out the number of scanning movements in the opposite direction, which is generally the case. In the embodiment shown in FIG. 13, in addition to an expansion or contraction of the article, the position offset may also include a drift of the article.

In order to ensure that the substrate W sticks to the substrate table WT, a vacuum clamping force may be increased. Further, this may be achieved by smoothing the top of the supporting protrusions.

One or more embodiments of the invention have been illustrated with reference to an article support that is substantially circular and that is constructed to support a substantially circular article and that is used for supporting a substrate to be exposed by the projection beam. However, it will be clear to the skilled person that the invention may also or alternatively be applied to any other article, in particular, to an article in the form of a mask (reticle), or to an article support and article having other shapes, for example, square shapes or fractions of a circle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
an article support constructed to support a first article, capable of imparting a radiation beam with a pattern in its cross-section to form a patterned radiation beam, in a beam path of the radiation beam or a second article to be placed in a beam path of the patterned radiation beam, the article support comprising:
a plurality of supporting protrusions on which the first article or the second article is disposed in use, wherein the plurality of supporting protrusions are constructed to define a support zone to provide a plane of support for the first article or the second article, so that when the first article or the second article is subjected to a thermal load the support zone allows at least a portion of the first article or the second article to expand or contract to reduce the build up of a mechanical stress in the first article or second article, respectively, while maintaining the first article or second article substantially fixed to the article support, and a position sensor configured to determine a position offset, in a direction lying in the plane of the support zone, of the first article or the second article over a period of time; and a projection system configured to project a patterned radiation beam onto a target portion of a second article.

2. The apparatus according to claim 1, further comprising a feedback circuit configured to provide a signal to an illumination system configured to condition the radiation beam, the projection system, the article support, or any combination thereof, wherein the signal causes the illumination system, the projection system, or both, to produce a radiation beam and a patterned radiation beam, respectively, which takes into account the position offset and/or the article support to correct for the position offset, respectively.

3. The apparatus according to claim 1, wherein one or more of the supporting protrusions of the support zone is constructed to be flexible having a first degree of freedom in a plane in which the first article or second article is disposed in use, wherein the one or more supporting protrusions is oriented so that the first degree of freedom extends in a direction corresponding to a first direction in which the position offset extends to allow the first article or the second article to expand or contract in the first direction.

4. The apparatus according to claim 3, wherein the direction is radial with respect to a location on the flexible one or more supporting protrusions corresponding to a center of the first article or the second article, respectively, when the first article or second article is disposed on the support zone.

5. The apparatus according to claim 4, wherein the radial direction extends from the location in an outwardly direction in the plane in which the first article or the second article is disposed in use on the support zone.

6. The apparatus according to claim 1, wherein one or more supporting protrusions is constructed as a leaf spring.

7. The apparatus according to claim 3, wherein one or more supporting protrusions has a second degree of freedom.

8. The apparatus according to claim 7, wherein the second degree of freedom extends in a direction orthogonal to the direction in which the first degree of freedom extends in the plane in which the first article or second article is disposed in use on the support zone.

9. The apparatus according to claim 7, wherein the second degree of freedom extends in a second direction in which the position offset extends to allow the first article or the second article to expand or contract in the second direction.

10. The apparatus according to claim 9, comprising a position sensor configured to determine a position offset in the second direction.

11. The apparatus according to claim 7, wherein the one or more supporting protrusions comprises a first fulcrum to allow the one or more supporting protrusions to pivot around in the first direction and a second fulcrum to allow the one or more supporting protrusions to pivot around in the second direction.

12. The apparatus according to claim 11, wherein each of the first and second fulcra comprises recesses formed on opposing sides of the one or more supporting protrusions in the first and second directions in order to provide the first and second degrees of freedom, respectively.

13. The apparatus according to claim 1, wherein the position sensor is configured to determine an intrafield parameter offset by determining a displacement of one or more of the supporting protrusions.

14. The apparatus according to claim 13, wherein the one or more supporting protrusions comprises a strain gauge configured to determine the displacement.

15. The apparatus according to claim 13, wherein each of the one or more supporting protrusions comprises first and second opposing faces extending in a plane orthogonal to the first direction, on which a first strain gauge and a second strain gauge are disposed, respectively, so that the displacement of the supporting protrusion is determined by a compression and/or expansion of the first and second opposing faces on which the first gauge and second strain gauges are disposed, respectively.

16. The apparatus according to claim 15, wherein the first and second strain gauges are arranged in a Wheatstone bridge configuration.

17. The apparatus according to claim 13, wherein the one or more supporting protrusions comprises a capacitive plate configured to determine the displacement.

18. The apparatus according to claim 17, wherein each of the one or more supporting protrusions comprises first and second opposing faces extending in a plane orthogonal to the first direction, on which a first capacitive and a second capacitive plate are disposed, respectively, so that the displacement of the supporting protrusion is determined by the capacitances measured across the first and second capacitive plates, respectively.

19. The apparatus according to claim 18, wherein the first and second capacitive plates are arranged in a Wheatstone bridge configuration.

20. The apparatus according to claim 1, wherein the position sensor is configured to determine position offsets of respective points on the first or second article by determining a displacement of the first or second article.

21. The apparatus according to claim 20, wherein the second article is a substrate and the position sensor is directed towards a backside of the substrate to determine the position of the substrate directly.

22. The apparatus according to claim 21, wherein the position sensor comprises an optical sensor.

23. The apparatus according to claim 22, wherein the substrate comprises a reference mark whose position offset is determined by the optical sensor.

24. The apparatus according to claim 3, wherein the support zone comprises a first region comprising the one or more supporting protrusions having the first degree of freedom, the first region configured to support an area of the first article or second article for which a larger than average position offset is expected.

25. The apparatus according to claim 24, wherein the first region is configured to support an outer edge of the first article or second article.

26. The apparatus according to claim 24, wherein the support zone comprises a second region comprising a plurality of supporting protrusions having zero degrees of freedom, respectively.

27. The apparatus according to claim 26, wherein the second region is configured to support an area of the first article or the second article for which a smaller than average position offset is expected.

28. The apparatus according to claim 26, wherein the second region is configured to support a central region of the first article or the second article.

29. The apparatus according to claim 26, wherein the second region is adjacent the first region.

30. The apparatus according to claim 24, wherein the support zone comprises a third region comprising a plurality of supporting protrusions having a second degree of freedom.

31. The apparatus according to claim 1, wherein one or more supporting protrusions comprise a damper configured to dampen the one or more supporting protrusions to the effects of high frequency movements of the article support while being resilient at low frequencies.

32. The apparatus according to claim 31, wherein the first article or second article remains fixed to the article support due to a frictional force between the first article or second article and the article support.

33. The apparatus according to claim 1, wherein the support zone provides a substantially flat plane of support for the first article or second article.

34. The apparatus according to claim 1, wherein the position sensor is configured to determine the position offset of a certain point on the first article or second article.

35. The apparatus according to claim 1, wherein the position offset of the first article or second article results from the expansion or contraction of the first article or second article, respectively.

36. The apparatus according to claim 1, wherein the expansion or contraction dealt with is a local expansion or contraction of the first article or second article.

37. A lithographic projection apparatus arranged to transfer a pattern from a patterning device onto a substrate, the lithographic projection apparatus comprising an article support constructed to support the substrate, the article support comprising a plurality of supporting protrusions on which the substrate is disposed in use, the plurality of supporting protrusions constructed to define a support zone to provide a plane of support for the substrate, so that when the substrate is subjected to a thermal load the support zone allows at least a portion of the substrate to expand or contract to reduce the build up of a mechanical stress, while maintaining the substrate substantially fixed to the article support, the article support further comprising a position sensor configured to determine a position offset, in a direction lying in the support zone, of the substrate over a period of time.

38. An apparatus comprising an article support constructed to support an article, the article support comprising a plurality of supporting protrusions on which the article is disposed in use, wherein the plurality of supporting protrusions are constructed to define a support zone to provide a plane of support for the article, so that when the article is subjected to a thermal load the support zone allows at least a portion of the article to expand or contract to reduce the build up of a mechanical stress, while maintaining the article substantially fixed to the article support, the article support further comprising a position sensor configured to determine a position offset of the article over a period of time.

39. A device manufacturing method, comprising:
projecting a patterned beam of radiation onto a substrate;
flexibly supporting the substrate on an article support constructed to support the substrate to be placed in a beam path of the patterned beam, the article support comprising a plurality of flexible supporting protrusions on which the substrate is disposed in use, so that when the substrate is subjected to a thermal load, the plurality of flexible supporting protrusions allow at least a portion of the substrate to expand or contract to reduce the build up of a mechanical stress in the substrate; and determining a position offset of the substrate resulting from the expansion, contraction, drift, or any combination thereof, of the substrate over a period of time using a position sensor.

40. The method according to claim 39, comprising integrating the position sensor into one or more of the flexible supporting protrusions to measure the position offset.

41. The method according to claim 40, comprising reading the position sensor in the vicinity of the area about to be exposed just before the patterned beam of radiation is projected onto the substrate.

42. The method according to claim 41, comprising determining the difference between the readings obtained during the process in which the substrate is measured and just before the patterned beam of radiation is projected onto the substrate.

43. The method according to claim 42, comprising determining the difference for every die to be exposed.

44. The method according to claim 42, comprising determining the difference for the exposure process as a whole.

45. The method according to claim 42, comprising using the difference to calculate an optimal intrafield parameter offset.

46. The method according to claim 45, comprising applying the optimal intrafield parameter offset during the projection of the patterned beam onto the substrate.

47. A method comprising flexibly supporting an article on an article support, the article support comprising a plurality of supporting protrusions on which the article is disposed in use wherein the plurality of supporting protrusions are constructed to define a support zone to provide a plane of support for the article, so that when the article is subjected to a thermal load, the support zone allows at least a portion of the article to expand or contract to reduce the build up of a mechanical stress in the article, and further comprising determining a position offset of a point on the article resulting from expansion, contraction, drift, or any combination thereof, of the article over a period of time.

* * * * *